United States Patent
Palara et al.

Patent Number: 5,661,430
Date of Patent: Aug. 26, 1997

[54] CIRCUIT FOR PREVENTING OPERATION OF PARASITIC COMPONENTS IN INTEGRATED CIRCUITS HAVING A POWER STAGE AND LOW-VOLTAGE CONTROL CIRCUITRY

[75] Inventors: Sergio Palara, Acitrezza; Raffaele Zambrano, S. Giovanni La Punta, both of Italy

[73] Assignees: SGS-Thomson Microelectronics S.r.l., Agrate Brianza; Consorzio per la Ricerca sulla Microelettronica nel Mezzogiorno, Catania, both of Italy

[21] Appl. No.: 529,805

[22] Filed: Sep. 19, 1995

[30] Foreign Application Priority Data

Sep. 21, 1994 [EP] European Pat. Off. .......... 94830444

[51] Int. Cl.⁶ .................................................. H03K 17/16
[52] U.S. Cl. .......................... 327/382; 327/535; 327/546; 327/566; 257/372; 257/394; 257/547
[58] Field of Search .................................. 327/382, 535, 327/542, 564, 565, 566, 534, 545, 546; 257/547, 372, 394, 901, 532, 535, 551, 552, 553, 500

[56] References Cited

U.S. PATENT DOCUMENTS

| | | | |
|---|---|---|---|
| 3,990,092 | 11/1976 | Yoshimura | 257/540 |
| 5,051,612 | 9/1991 | Agiman | 327/535 |
| 5,132,866 | 7/1992 | Raciti et al. | 361/56 |
| 5,475,273 | 12/1995 | Paparo et al. | 327/545 |

FOREIGN PATENT DOCUMENTS

| | | |
|---|---|---|
| 0 359 680 | 3/1990 | European Pat. Off. . |
| 57-042145 | 3/1982 | Japan . |

*Primary Examiner*—Timothy P. Callahan
*Assistant Examiner*—Kenneth B. Wells
*Attorney, Agent, or Firm*—David V. Carlson; Seed and Berry LLP

[57] ABSTRACT

An integrated circuit including a power stage, a low-voltage component separated from the power stage by an isolating region and a reference potential region at a reference potential. The power stage includes an N-type substrate region which may be biased to a terminal voltage with respect to the reference potential and the isolating region has P-type conductivity. The low-voltage component includes an N-type input region receiving an input voltage. The input voltage and the terminal voltage may oscillate a few tens of volts above or below the reference potential and turn on parasitic transistors. To prevent turning on of the parasitic transistors, switchable conductive paths are interposed between the isolating region on the one hand, and the substrate region, the input region and the reference potential region on the other, for electrically connecting the isolating region to one of the substrate region, input region and reference potential region which presents instant by instant the lowest potential.

27 Claims, 3 Drawing Sheets

5,661,430

CIRCUIT FOR PREVENTING OPERATION OF PARASITIC COMPONENTS IN INTEGRATED CIRCUITS HAVING A POWER STAGE AND LOW-VOLTAGE CONTROL CIRCUITRY

TECHNICAL FIELD

The present invention relates to a circuit for preventing operation of parasitic components in integrated circuits having a power stage and low-voltage control circuitry.

BACKGROUND OF THE INVENTION

As is known, there is a demand for integrated devices incorporating in the same chip both a power stage (e.g., MOSFET power transistor, VDMOS) and the relative low-voltage drive circuits (e.g., comprising NMOS and PMOS transistors).

In some applications, the drive voltage of such devices may oscillate between two fairly high values (a few tens of volts) symmetrical with respect to the reference voltage (ground), which causes a problem in maintaining isolation between the drive circuit components and the power stage.

For a clearer understanding of the problem, refer to FIG. 1 showing an integrated device 1 comprising a power transistor (VDMOS) 2 and relative control circuitry (drive stage) 3. The drain terminal D of VDMOS 2 presents voltage $V_D$, its source terminal S is grounded, its gate terminal G is driven by drive stage 3, and 4 indicates the relative parasitic diode. Power transistor 2 presents $N^+$-type source and drain regions. The drive stage 3 shows only an input terminal 5 supplied with input voltage $V_{IN}$ (oscillating drive voltage); an $N^+$-type region (input region) 6 is connected to input terminal 5 (and forming part of any component, e.g., constituting the collector region of an NPN transistor); and a $P^+$-type isolating region 7 surrounds and isolates region 6 from the substrate connected to or constituting the drain region of VDMOS 2. FIG. 1 also shows two parasitic NPN transistors 8, 9 and a parasitic PNP transistor 10, which are associated with the FIG. 1 structure as shown more clearly in the example integrated circuit implementation in FIG. 2.

FIG. 2 shows a cross section of a silicon wafer including an $N^+$-type substrate (substrate region) 11, and an $N^-$-type epitaxial layer 12 forming with substrate 11 the drain region of VDMOS 2. To the left is shown VDMOS 2 including $N^+$-type source regions (reference potential region) 15, polysilicon gate regions 16 embedded in insulating layer 17, and metal source line 18. To the right is shown a CMOS component (including in known manner an N-channel and P-channel MOS transistors) formed in a well comprising a P-type buried layer 20. $P^+$-type regions 22, 23 provide for isolating the various components. More specifically, region 22 encloses and isolates the low-voltage components, corresponds to region 7 in FIG. 1, and separates an $N^-$well layer 24 and a P-well layer 25 over buried layer 20. $N^-$well layer 24 presents an $N^+$-type region 29; and $P^+$-type regions 26 constituting the drain and source of the NMOS transistor are located beneath gate region 27 embedded in dielectric layer 28. P-well layer 25 presents $N^+$-type regions 30 constituting the drain and source of the NMOS transistor and located beneath gate region 31 embedded in dielectric layer 32. Metal lines 33 contact the NMOS and PMOS transistor regions in a well-known manner.

In the circuit structure of FIG. 2, the $N^+$-type type regions (e.g., regions 29, 30) form parasitic diodes together with isolating region 22, and, together also with epitaxial layer 12 and substrate 11, form parasitic NPN transistors 8 and 9 in FIG. 1. The bases of transistors 8, 9 are connected to the isolating region 7; the emitter of transistor 8 and the collector of transistor 9 are connected to $N^+$-type region 6; and the collector of transistor 8 and the emitter of transistor 9 are connected to the drain region of VDMOS 2. Moreover, region 23 (connected electrically to source region 15 by metal line 18) and regions 12 and 22 form the parasitic transistor 10 in FIG. 1. The parasitic transistor has its collector connected to isolating region 7, its base connected to drain terminal D, and its emitter connected to source terminal S of VDMOS 2.

With such a structure, isolating region 7 (22) cannot be grounded when drive voltage $V_{IN}$ is negative; in that case, if one of regions 29 or 30 is connected to voltage $V_{IN}$, the aforementioned diode (formed by said region 29 or 30 and isolating region 22) would be biased directly, and the transistor (8 in FIG. 1) formed by said regions and epitaxial layer 12 would turn on or operate to interfere with proper operation of the circuit 1.

Similarly, isolating region 22 cannot be connected directly to input voltage $V_{IN}$ in that, when voltage $V_{IN}$ is positive, the parasitic diode formed by isolating region 22 and epitaxial layer 12 would be biased directly, and the parasitic transistor (9 in FIG. 1) formed by the parasitic diode and the $N^+$ region connected to voltage $V_{IN}$ would be turned on, due also to the current injected by transistor 10 which is turned on when voltage $V_D$ is negative.

If isolating region 22 were to be grounded, parasitic transistor 9 would also be turned on with a negative voltage $V_D$.

SUMMARY OF THE INVENTION

It is an object of the present invention to provide a circuit for appropriately biasing the isolating region and so preventing the parasitic components of the integrated circuit from being turned on.

According to the present invention, there is provided a circuit for preventing turn-on or operation of parasitic components in integrated circuits having a power stage and low-voltage control circuitry.

According to the invention, the isolating region is connected instant by instant to the lowest-potential point via switches driven by the integrated circuit voltages.

BRIEF DESCRIPTION OF THE DRAWINGS

A preferred, non-limiting embodiment of the present invention will be described by way of example with reference to the accompanying drawings, in which.

DETAILED DESCRIPTION OF THE INVENTION

Figure 3:
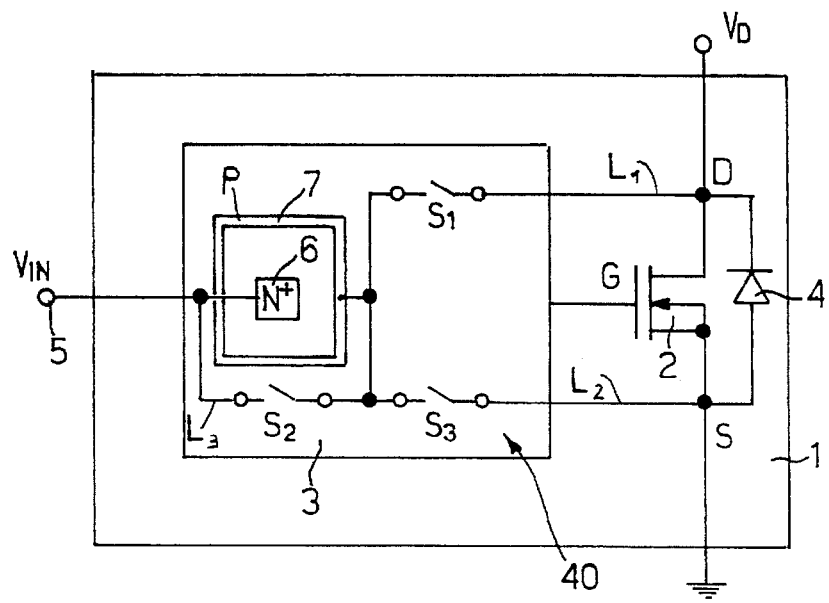
FIG. 3 is an operating circuit diagram according to the present invention.

Number 40 in FIG. 3 indicates a circuit for preventing turn-on of parasitic components; circuit 40 is housed in the same integrated device 1 including power VDMOS 2 and relative drive circuit 3. Drive circuit 3 shows the N$^+$-type region 6 as connected to input terminal 5 and biased to voltage $V_{IN}$, and isolating region 7.

Circuit 40 comprises three switches S1, S3, S2 located along respective connecting lines L1, L2, L3 interposed between isolating region 7 and, respectively, the drain terminal of VDMOS 2, the source terminal of VDMOS 2, and region 6 (i.e., input terminal 5). The term "switch" is used in the broad sense of the word meaning that it can become conducting or non-conducting depending on certain conditions.

Switches S1–S3 are driven so as to connect isolating region 7 instant by instant to the lowest-potential point as shown in the Table below. In the Table, "1" means the respective switch is conducting and "0" means the respective switch is non-conducting.

TABLE

| Condition | $V_{IN}$ | $V_D$ | $S_1$ | $S_2$ | $S_3$ |
| --- | --- | --- | --- | --- | --- |
| 1 | + | − | 1 | 0 | 0 |
| 2 | − | + | 0 | 1 | 0 |
| 3 | + | + | 0 | 0 | 1 |
| 4 | 0 | + | 0 | 0 | 1 |
| 5 | 0 | − | 1 | 0 | 0 |
| 6 | + | 0 | 1 | 0 | 0 |
| 7a | −> | − | 1 | 0 | 0 |
| 7b | −= | − | 0 | 1 | 0 |
| 7c | −< | − | 0 | 1 | 0 |
| 8 | − | 0 | 0 | 1 | 0 |
| 9 | 0 | 0 | 0 | 1 | 1 |

Consequently, when the drain terminal of VDMOS 2 presents a negative potential with a positive or zero input voltage $V_{IN}$ (conditions 1 and 5), switch S1 connects isolating region 7 to the drain terminal; when input voltage $V_{IN}$ is negative and drain voltage $V_D$ is positive (condition 2), switch S2 connects isolating region 7 to input terminal 5; when drain voltage $V_D$ is positive and input voltage $V_{IN}$ is positive or zero (conditions 3 and 4), switch S3 grounds isolating region 7; when $V_{IN}$ is positive and $V_D$ is zero (condition 6), then switch S1 connects isolating region 7 to the drain terminal of VDMOS 2; when $V_{IN}$ and $V_D$ are both negative, and $V_D$ is at a greater negative potential than $V_{IN}$ (condition 7a), switch S1 connects region 7 to the drain terminal of VDMOS 2; when $V_{IN}$ and $V_D$ are both negative, but $V_{IN}$ is at equal potential to (condition 7b) or at less negative potential than $V_D$ (condition 7c), then switch S2 connects region 7 to input terminal 5; when $V_{IN}$ is negative and $V_D$ is zero (condition 8), switch S2 connects region 7 to input terminal 5; and when $V_{IN}$ and $V_D$ are both at zero (condition 9), switches S2 and S1 connect region 7 to input terminal 5 and ground. Thus, parasitic transistors 8 and 9 can never be turned One circuit embodiment of switches S1–S3 including bipolar transistors and Schottky diodes is shown in FIGS. 4 and 5 wherein the components are rearranged to show more clearly the behavior of the circuit in two different operating conditions.

Figure 4:
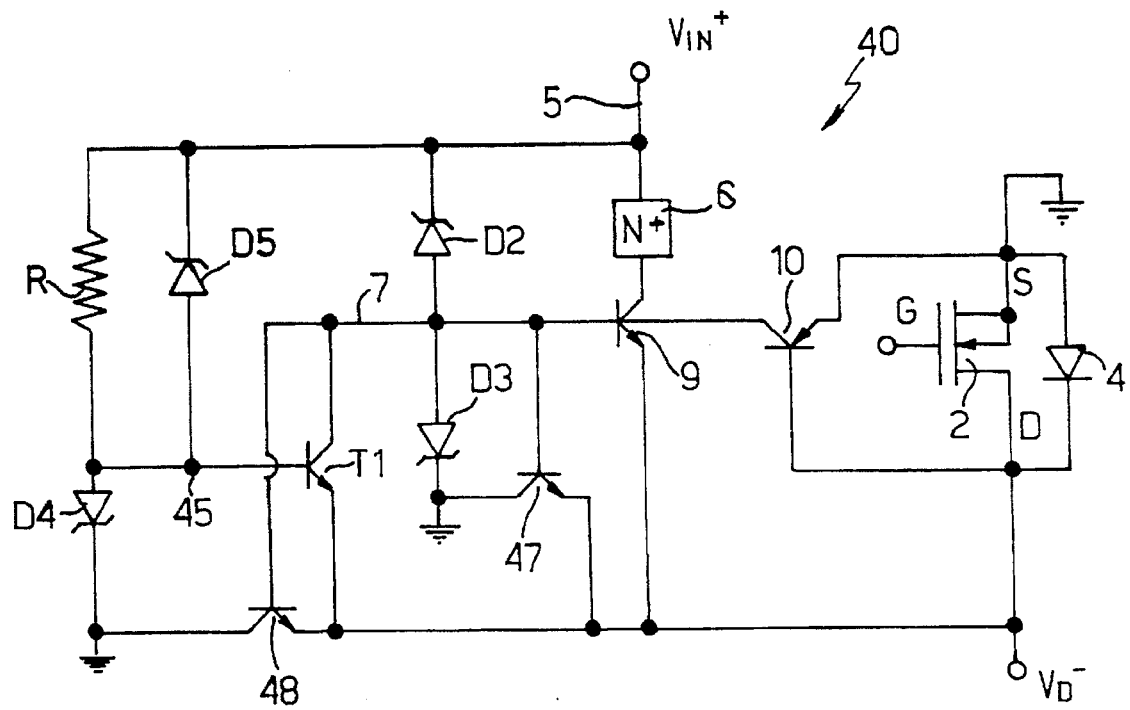
FIGS. 4 and 5 are more detailed circuit diagrams representing two different operating conditions according to the present invention.
Figure 5:
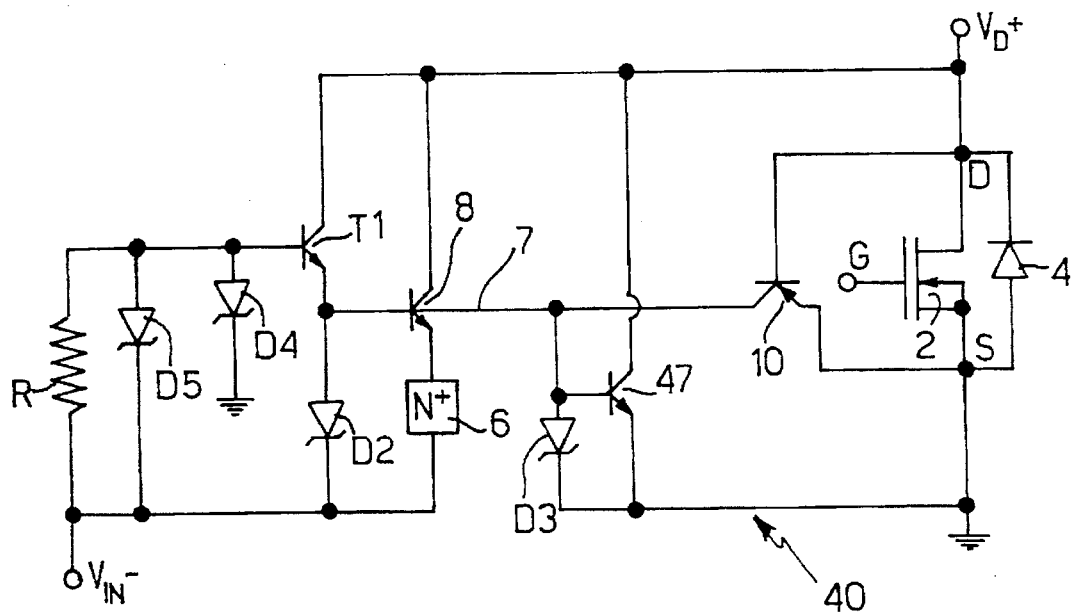

In both FIGS. 4 and 5, switch S1 may be represented by transistor T1, switch S2 by Schottky diode D2, and switch S3 by Schottky diode D3; and to ensure correct operation of the circuit, there are two additional Schottky diodes D4, D5, and a resistor R.

More specifically, NPN transistor T1 is shown turned upside down in FIGS. 4 and 5 to take into account the different voltage conditions involved. For example, the collector of T1 in FIG. 4 is shown as an emitter in FIG. 5 due to the different voltages being applied to the transistor T1. In FIG. 4, transistor T1 has the collector terminal connected to isolating region 7 (shown as a line), the emitter terminal connected to drain terminal D of VDMOS 2, and the base terminal connected to node 45; Schottky diode D2 has the anode connected to isolating region 7, and the cathode connected to input terminal 5; and Schottky diode D3 has the anode connected to isolating region 7, and the cathode grounded.

Figure 1:
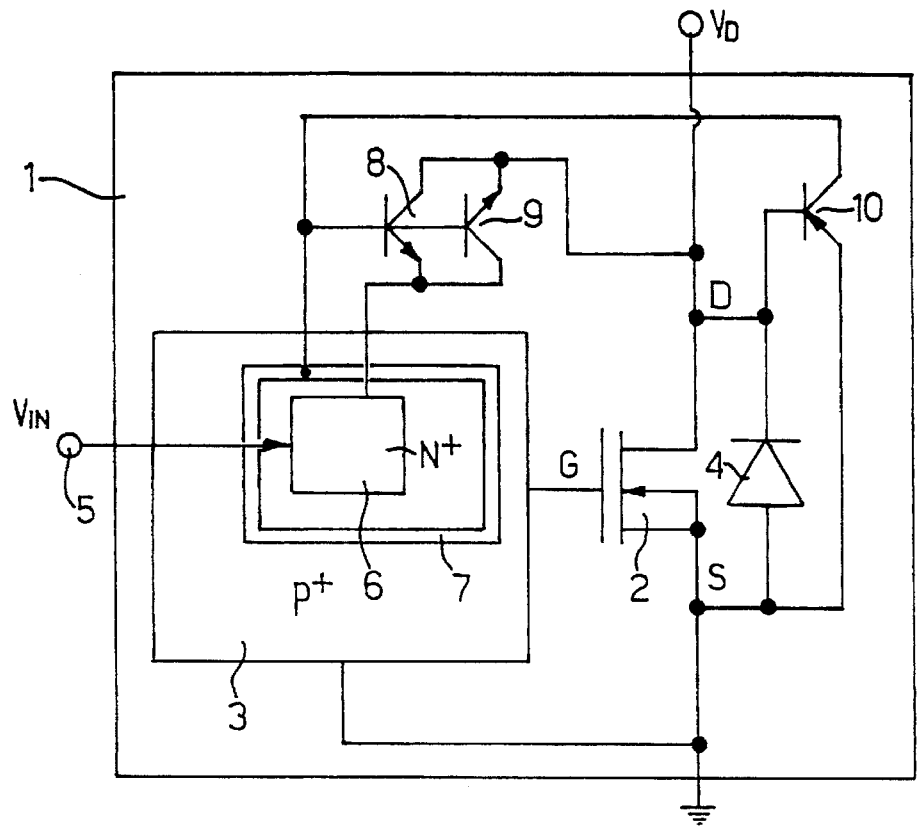
FIG. 1 is a circuit diagram of a prior art integrated device having parasitic components.
Figure 2:
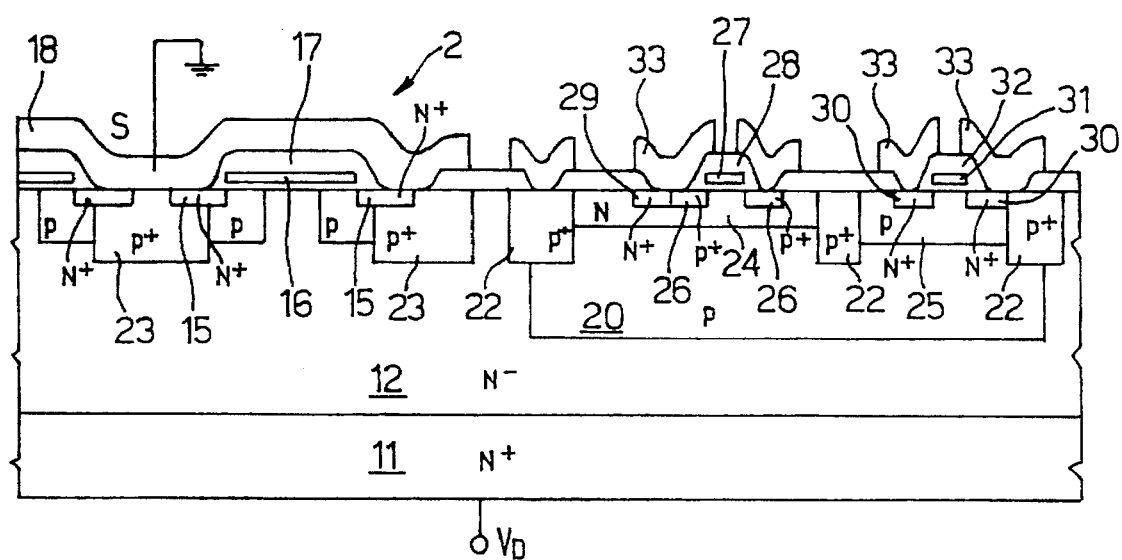
FIG. 2 is a cross section of a semiconductor material implementing some of the relevant circuit components of FIG. 1.
Figure 6:
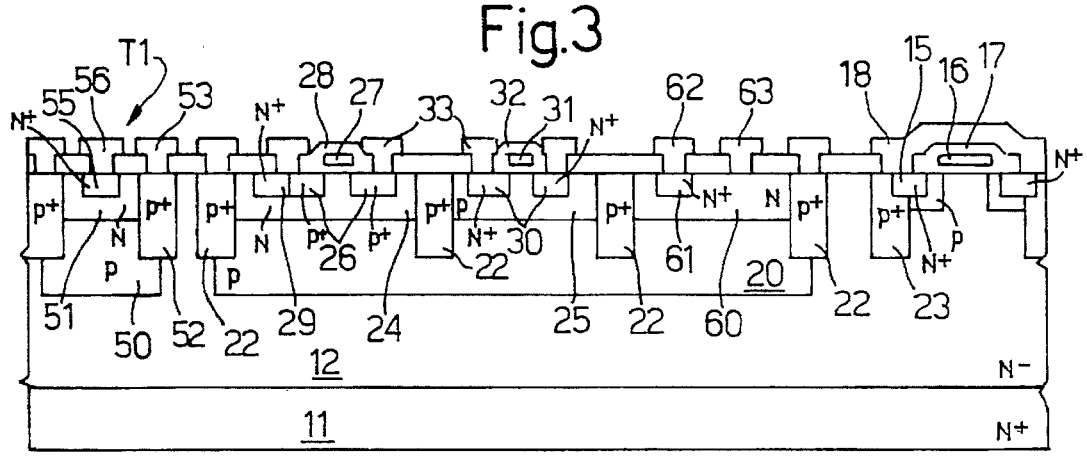
FIG. 6 is a cross section of a semiconductor material implementing some of the circuit components of FIG. 3 according to one embodiment of the present invention.

Node 45 is grounded via Schottky diode D4 (with its anode connected to node 45), and is connected to input terminal 5 via a resistor R and Schottky diode D5. Resistor R and diode D5 are connected in parallel with each other, with the anode of D5 connected to node FIGS. 4 and 5 also show two parasitic transistors 47 and 48 associated with the Schottky diodes. For a clearer understanding, refer to FIG. 6 showing one possible implementation of part of circuit 40. More specifically, FIG. 6 shows a cross section of a wafer of semiconductor material in which the components are implemented using the same technology as in FIG. 2, and wherein any parts common to both FIGS. 6 and 2 are shown using the same reference numerals.

FIG. 6 shows the implementation of transistor T1 and one of the Schottky diodes. More specifically, transistor T1 is implemented by a vertical transistor including a P-type buried region 50 (forming the base region) separated from buried region 20 in which the CMOS components are formed and in which the Schottky diodes may be formed. Over buried region 50, there is provided an N$^-$well 51 isolated by an isolating region 52 to be connected electrically to node 45 by base contacts 53 and metal lines (not shown). N$^-$well 51 houses an N$^+$-type region 55 connected to isolating region 22 by contact 56 and a metal line (not shown).

The Schottky diode implemented over buried region 20 comprises an N$^-$well 60 isolated from the other well regions 24, 25 by a portion of isolating region 22, and housing an N$^+$-type region 61. Region 61 is connected to a contact 62 for connection, for example, to input terminal 5 (diodes D2, D5) or ground (diodes D3, D4); while N$^-$well 60 is connected to a contact 63 (with which it forms a Schottky barrier) connected, for example, to isolating region 22 (diodes D3, D5) or to node 45 (diodes D4, D5).

Regions 51 and 55 constituting the collector of transistor T1 are formed simultaneously with N$^-$well regions 24, 25, 60 and N$^+$-type regions 29, 30, 61.

As can be seen, the Schottky diode is associated with a parasitic transistor formed by regions 61, 60 (emitter or collector), 22, 20 (base) and 12, 11 (collector or emitter).

Consequently, diodes D3 and D4 of FIG. 4 are associated with transistors 47, 48 having the emitter formed by regions 11, 12 in FIG. 6, the base formed by isolating region 22, and the collector formed by region 61. Similarly, diodes D2 and D5 are associated with respective parasitic transistors (not shown) similar to parasitic transistor T1.

In FIG. 4, circuit 40 is shown with a positive input voltage $V_{IN}$ and a negative drain voltage $V_D$. In this state, transistor T1 is turned on (saturated) and, like switch S1 in FIG. 3, maintains isolating region 7 at a potential close to drain voltage $V_D$. As such, parasitic transistor 9 "sees" a very low base-emitter voltage drop which is insufficient to turn that transistor on despite the charges injected by parasitic transistor 10.

In the above operating state, diodes D3, D2 and D5 are reverse biased; diode D4 is turned on and biases the base of T1; and, being insufficiently biased like parasitic transistor 9, parasitic transistors 47 and 48 are also turned off.

Diode D4 and resistor R ensure that, during the falling half wave of voltage $V_D$, transistor T1 is turned on before parasitic transistors 9, 10, thus preventing parasitic transistors 9, 10 from being turned on. In fact, T1 "sees" a slightly higher base-emitter voltage drop—equal to $V_D$+VF (where VF is the voltage drop over diode D4)—than transistor 10 which sees a base-emitter voltage drop equal to $V_D$. Consequently, as $V_D$ falls, and due also to resistor R supplying the base of transistor T1, T1 is turned on in advance of transistor 10, thus preventing any problems arising as $V_D$ falls.

FIG. 5 shows the circuit diagram of FIG. 4 modified to illustrate the behavior of the circuit with a negative input voltage $V_{IN}$ and a positive drain voltage $V_D$. In FIG. 5, parasitic transistor 8, which is the one likely to be turned on in this bias state, is shown in place of parasitic transistor 9; and transistors T1 and 47 are turned upside down (exchanging the collector for the emitter) to show the possible turn-on condition.

In FIG. 5, T1 also represents the parasitic transistor associated with diodes D2 and D5 (as in FIG. 4) and the parasitic transistor associated with D3 (as in FIG. 4) and D4 (the parasitic transistor of D4 in fact has a grounded emitter, a base formed by isolating region 7, and a collector formed by layers 11, 12, in exactly the same way as transistor 47).

Under the operating state of FIG. 5, parasitic transistor 8 is prevented from being turned on by Schottky diode D2 maintaining isolating region 7 at a voltage close to input voltage $V_{IN}$ (approximately 0.2 V higher) and producing an insufficient voltage drop at the base-emitter junction of transistor 8 (which requires 0.6–0.7 V for it to be turned on).

Moreover, diodes D3, D5 and their associated parasitic transistors are turned off. D3 in fact is reverse biased, as is the base-emitter junction of the associated parasitic transistor 47. Diode D4 is also reverse biased. D5 is turned on and maintains the base of T1 at the same potential as the emitter, so that T1 remains off (as required, particularly in the case of a high drain voltage $V_D$, for preventing failure of transistor T1). Finally, parasitic transistor 10 is also turned off, by virtue of its base presenting a higher potential as compared with the emitter and collector.

In the circuits of FIGS. 4 and 5, diode D3 provides grounding for isolating region 7 when input voltage $V_{IN}$ and drain voltage $V_D$ are both positive, or when one is zero and the other is positive. In all these cases, diode D3 is turned on and maintains isolating region 7 at the minimum potential present in the circuit; and transistors 8, 9 and T1 are maintained in an off state.

Circuit 40 of FIGS. 4 and 5 may be easily implemented, for example, using the structure of FIG. 6. In particular, the resistor R may be integrated by using the polysilicon layer forming the gates of the MOSFET transistors (27 and 15 in FIG. 6), or by exploiting the diffused drain/source regions of the same MOSFET transistors, or by defining a higher-resistivity P-type diffused layer in a region isolated from the power stage.

Figure 7:
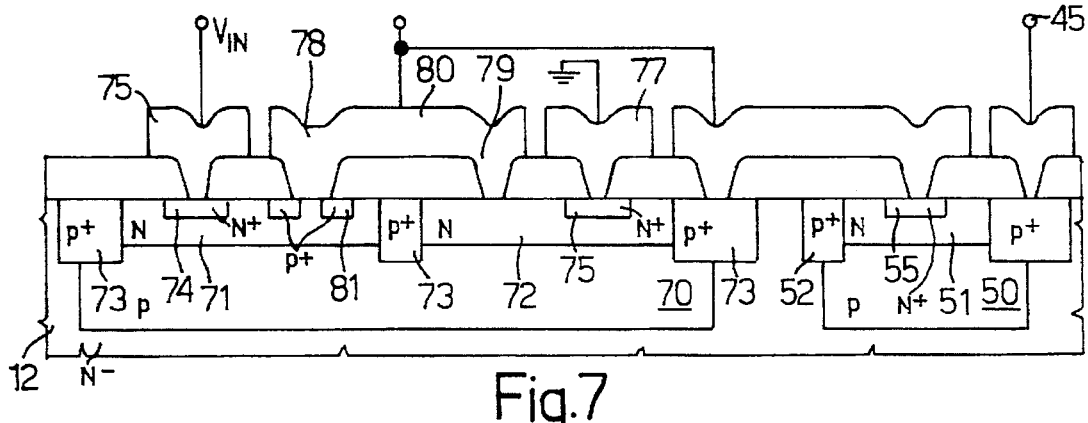
FIG. 7 is an alternative embodiment of some of the circuit components of FIG. 6.

FIG. 7 shows an alternative embodiment of diodes D2, D3 and transistor T1 using the same technique as in FIG. 6. Any elements common to both are therefore indicated using the same reference numerals with no further description.

Number 70 in FIG. 7 indicates the P-type buried layer over which the diodes are formed, and over which are provided two N⁻well regions 71, 72 separated by isolating regions 73 similar to regions 22, 23, 52. N⁻well regions 71, 72 house N⁺-type regions 74, 75 for connection to contacts 76, 77, and are directly contacted by aluminum contacts 78, 79 for forming the Schottky diodes of which regions 71, 72 form the cathodes. Contacts 78, 79 (diode anodes) are connected by a metal line 80 for electrically contacting the anodes of Schottky diodes D2 and D3.

The FIG. 7 implementation is characterized by a P⁺-type ring 81 in N⁻well region 71, surrounding contact 78 and which provides for increasing the breakdown voltage of diode D2. In fact, if the breakdown voltage of the Schottky diodes is below the maximum input voltage $V_{IN}$ value, the potential of isolating region 7 (anode of diode D2) is unable to follow $V_{IN}$, thus impairing operation of the device as a whole.

The above breakdown voltage, as is well known, is limited by the rapid increase in the electric field along the periphery of the metal-semiconductor interface. This problem, however, may be solved by forming a guard ring, such as ring 81, connected to the anode of the diode and located along the edge of the Schottky junction.

The advantages of the circuit described are as follows. First, tying the isolating regions instant by instant to the lowest potential prevents the junction between the drain region of the power VDMOS and the isolating regions from being turned on and thereby impairing proper operation of the integrated device.

Second, the circuit is easily integrated, and presents a high degree of reliability.

Clearly, changes may be made to the circuit as described and illustrated herein without departing from the scope of the present invention. In particular, the switches may be formed using other components, the implementation shown being provided purely by way of example. Accordingly, the scope of the present invention is not limited to the foregoing specification, but instead is given by the appended claims along with their full range of equivalents.

We claim:

1. A circuit for preventing operation of parasitic components in a semiconductor device having a reference potential region at a reference potential, a power stage and a low-voltage component separated from the power stage by an isolating region, the power stage having a substrate region at a terminal voltage relative to the reference potential, the low-voltage component having an operating voltage range lower than the operating voltage range of the power stage and further having an input region receiving an input voltage, the circuit comprising:

a first voltage-controlled transistor switch having a first terminal connected to the isolating region, a second terminal connected to the substrate region, and a control terminal connected to the input region;

a second voltage-controlled switch connected between the isolating region and the input region; and a third voltage-controlled switch connected between the isolating region and the reference potential region, the transistor switch and second and third switches together operable to connect the isolating region to a selected region having the lowest potential among the input region, the reference potential region, and the substrate region.

2. The circuit according to claim 1 wherein the transistor switch is a bipolar transistor.

3. The circuit according to claim 2 wherein the bipolar transistor is a vertical transistor having the substrate region as the second terminal.

4. The circuit according to claim 1 further comprising a diode connected between the control terminal of the transistor switch and the reference potential region.

5. The circuit according to claim 4, further comprising a bias resistor-connected between the control terminal of the transistor switch and the input region.

6. The circuit according to claim 1, further comprising a diode connected between the control terminal of the transistor switch and the input region, and operable to maintain the transistor switch in an off state when the input voltage is less than the reference potential and the terminal voltage is greater than the reference potential.

7. A circuit for preventing operation of parasitic components in a semiconductor device having a reference potential region at a reference potential, a power stage and a low-voltage component separated from the power stage by an isolating region, the power stage having a substrate region at a terminal voltage relative to the reference potential, the low-voltage component having an operating voltage range lower than the operating voltage range of the power stage and further having an input region receiving an input voltage, the circuit comprising:

a first voltage-controlled switch connected between the isolating region and the substrate region;

a second voltage-controlled diode switch connected between the isolating region and the input region; and a third voltage-controlled switch connected between the isolating region and the reference potential region, the first and third switches and the second diode switch together operable to connect the isolating region to a selected region having the lowest potential among the input region, the reference potential region, and the substrate region.

8. The circuit according to claim 7 wherein the second diode switch is a Schottky diode, the Schottky diode including:

a cathode region within the semiconductor device;

a metal electrode defining an anode region and contacting the cathode region, the contact area defining a Schottky junction; and a P-type guard ring connected to the metal electrode and surrounding a portion of the cathode region along the edge of the Schottky junction, the guard ring operable to increase the breakdown voltage of the Schottky diode.

9. The circuit according to claim 7 wherein the third switch is a diode switch.

10. A circuit for preventing turn-on of parasitic components in an integrated circuit including at least a power stage, a low-voltage component separated from said power stage by an isolating region, and a reference potential region at a reference potential, said power stage including an N-type substrate region which may be biased to a terminal voltage with respect to said reference potential, said isolating region having P-type conductivity; and said low-voltage component having an operating voltage range lower than the operating voltage range of said power stage and further having an N-type input region receiving an input voltage, the circuit comprising:

a first voltage-controlled transistor switch having a first terminal connected to said isolating region, a second terminal connected to said substrate region, and a control terminal connected to said input region;

a second voltage-controlled switch connected between said isolating region and said input region; and a third voltage-controlled switch connected between said isolating region and said reference potential region, said first transistor switch and second and third switches together operable to electrically connect said isolating region to a region, selected among said substrate, input and reference potential regions, which presents instant by instant the lowest potential.

11. The circuit as claimed in claim 10 wherein said first transistor switch is a bipolar transistor.

12. The circuit as claimed in claim 11 wherein said first transistor switch is a vertical transistor having said second terminal formed by said substrate region.

13. The circuit as claimed in claim 10, further comprising a diode connected between said control terminal of said first transistor switch and said reference potential region.

14. The circuit as claimed in claim 13, further comprising a bias resistor connected between said input region and said control terminal of said first transistor switch.

15. The circuit as claimed in claim 10, further comprising a diode connected between said control terminal of said first transistor switch and said input region for maintaining said first transistor switch in an off state when said input voltage is less than and said terminal voltage is greater than said reference potential.

16. A circuit for preventing turn-on of parasitic components in an integrated circuit including at least a power stage, a low-voltage component separated from said power stage by an isolating region, and a reference potential region at a reference potential, said power stage including an N-type substrate region which may be biased to a terminal voltage with respect to said reference potential, said isolating region having P-type conductivity; and said low-voltage component having an operating voltage range lower than the operating voltage range of said power stage and further having an N-type input region receiving an input voltage, the circuit comprising:

a first voltage-controlled switch connected between said isolating region and said substrate region;

a second voltage-controlled diode switch connected between said isolating region and said input region; and a third voltage-controlled switch connected between said isolating region and said reference potential region, said second diode switch and first and third switches together operable to electrically connect said isolating region to a region, selected among said substrate, input and reference potential regions, which presents instant by instant the lowest potential.

17. The circuit as claimed in claim 16 wherein said third switch is a diode switch.

18. The circuit as claimed in claim 17 wherein said diode switches are Schottky diodes.

19. The circuit as claimed in claim 18 wherein said Schottky diodes are formed by a Schottky junction between a semiconductor material region and a metal electrode, for respectively forming anode and cathode regions; and said Schottky diodes include P-type guard rings connected electrically to said anode region of said Schottky diodes and surrounding said semiconductor material region along the edge of said Schottky junction.

20. The circuit as claimed in claim 16 wherein said power stage comprises a MOSFET power transistor; said substrate region forms the drain region of said MOSFET power transistor; and said reference potential region is connected to the source region of said MOSFET power transistor.

21. A circuit for preventing operation of parasitic components in a semiconductor device having a reference potential region at a reference potential, a power stage and a low-voltage component separated from the power stage by an isolating region, the power stage having a substrate region at a terminal voltage relative to the reference potential, the low-voltage component having an operating voltage range lower than the operating voltage range of the power stage and further having an input region receiving an input voltage, the circuit comprising:

a transistor switch connected between the isolating region and the substrate region, and having a control terminal connected to the input region;

a first switch connected between the isolating region and the input region; and a second switch connected between the isolating region and the reference potential region, the transistor switch and the first and second switches together operable to connect the isolating region to a selected region having the lowest potential among the input region, the reference potential region, and the substrate region.

22. The circuit according to claim 21 wherein the transistor is a bipolar vertical transistor having the substrate region defining either the collector or emitter.

23. The circuit according to claim 21, further comprising:

a diode connected between the control terminal of the transistor switch and the reference potential region; and a bias resistor connected between the control terminal of the transistor switch and the input region, the diode and the bias resistor together biasing the control terminal of the transistor switch.

24. The circuit according to claim 21, further comprising a diode connected between the control terminal of the transistor switch and the input region, and operable to maintain the transistor switch in an off state when the input voltage is less than the reference potential and the terminal voltage is greater than the reference potential.

25. A circuit for preventing operation of parasitic components in a semiconductor device having a reference potential region at a reference potential, a power stage and a low-voltage component separated from the power stage by an isolating region, the power stage having a substrate region at a terminal voltage relative to the reference potential, the low-voltage component having an operating voltage range lower than the operating voltage range of the power stage and further having an input region receiving an input voltage, the circuit comprising:

a first switch connected between the isolating region and the substrate region;

a second diode switch connected between the isolating region and the input region; and a third switch connected between the isolating region and the reference potential region, the second diode switch and the first and third switches together operable to connect the isolating region to a selected region having the lowest potential among the input region, the reference potential region, and the substrate region.

26. The circuit according to claim 25 wherein the second diode switch is a Schottky diode including:

a cathode region within the semiconductor device;

a metal electrode defining an anode region and contacting the cathode region, the contact area defining a Schottky junction; and a P-type guard ring connected to the metal electrode and surrounding a portion of the cathode region along the edge of the Schottky junction, the guard ring operable to increase the breakdown voltage of the Schottky diode.

27. The circuit according to claim 25 wherein the third switch is a diode switch providing a conductive path between the isolating region and the reference potential region when the input voltage is greater than or equal to the reference potential and the terminal voltage is greater than the reference potential.

* * * * *